United States Patent [19]

Naarmann et al.

[11] 4,412,942

[45] Nov. 1, 1983

[54] PREPARATION OF ELECTRICALLY CONDUCTIVE POLYMERS

[75] Inventors: Herbert Naarmann, Wattenheim; Klaus Penzien, Frankenthal; Johannes Schlag; Petr Simak, both of Ludwigshafen, all of Fed. Rep. of Germany

[73] Assignee: BASF Aktiengesellschaft, Fed. Rep. of Germany

[21] Appl. No.: 373,158

[22] Filed: Apr. 29, 1982

[30] Foreign Application Priority Data

May 11, 1981 [DE] Fed. Rep. of Germany ....... 3118630

[51] Int. Cl.$^3$ ............................................. H01B 1/06
[52] U.S. Cl. .................................. 252/518; 252/512; 252/519; 252/521; 525/328.1
[58] Field of Search ............... 252/500, 512, 519, 518, 252/521; 525/336, 344, 355, 351, 337, 335, 367, 353; 526/285

[56] References Cited

U.S. PATENT DOCUMENTS 4,204,216  5/1980  Heeger et al. ...................... 252/500
4,222,903  9/1980  Heeger et al. ...................... 252/500

FOREIGN PATENT DOCUMENTS 3027529  of 0000  Fed. Rep. of Germany .
3104408  of 0000  Fed. Rep. of Germany .
3105948  of 0000  Fed. Rep. of Germany .

Primary Examiner—Joseph L. Schofer
Assistant Examiner—J. M. Reddick
Attorney, Agent, or Firm—Keil & Witherspoon

[57] ABSTRACT

A process for the preparation of stable electrically conductive polymers, having conductivities greater than $10^{-2}$ S/cm, wherein a polyacetylene is reacted with from 1 to 100, preferably from 10 to 33, % by weight of tosylmethyl isocyanide and from 0.1 to 70, preferably from 5 to 35, % by weight of an alkali metal or its amide, or of a Lewis acid. The polymers obtained can be used in electrical engineering for the production of solar cells, for the conversion and fixing of radiation and for the production of electrical and magnetic switches and electrical storage devices, and can also be used for the antistatic treatment of plastics.

4 Claims, No Drawings

PREPARATION OF ELECTRICALLY CONDUCTIVE POLYMERS

The present invention relates to a process for the preparation of stable electrically conductive polymers from polyacetylenes, the polymers having electrical conductivities greater than $10^{-2}$ S/cm.

German Laid-Open Applications DOS Nos. 3,029,206, 3,027,529 and 3,026,328 have proposed converting polyacetylenes into electrically conductive polymers by the addition of a complexing agent, for example a heavy metal-phosphorus complex, or of black phosphorus and an alkali metal or its amide, or of black phosphorus and a strong Lewis acid. German Laid-Open Application DOS 3,104,408 also discloses that electrically conductive polymers may be obtained by adding a nitroso derivative and thereafter a strong Lewis acid with a $pK_a$ of from $-10$ to $+4$ or a strong base to an organic polymer from the polyacetylene series, in the absence of moisture and of oxygen. It has also been proposed to prepared stable electrically conductive polymers by heating electrically conductive polyacetylenes p-doped with Lewis acids to 500°–1,100° C. in the absence of oxygen and moisture (cf. German Laid-Open Application DOS No. 3,105,948).

It is an object of the present invention to provide stable electrically conductive polymers based on polyacetylene by a simple chemical procedure in which subsequent heating to high temperatures is not necessary.

We have found that this object is achieved by reacting a polyacetylene with from 1 to 100% by weight of tosylmethyl isocyanide and from 0.1 to 70% by weight of a complexing agent, the percentages being based on the polyacetylene. The alkali metals or their amides, or Lewis acids, are known to be suitable complexing agents (frequently also referred to as dopants). In a preferred procedure, the polyacetylene is reacted with from 10 to 30% by weight of tosylmethyl isocyanide and from 5 to 35 percent by weight of an alkali metal or its amide, or of a Lewis acid. In a particularly useful process, the polyacetylene is first reacted with tosylmethyl isocyanide to give a polymer containing structural units of the formula:

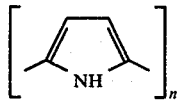

where n is 5–200, and this product is then reacted with an alkali metal or its amide, or with a Lewis acid. The Lewis acid is preferably a halogen derivative of an element of group III, IV, V, VI, VII or VIII of the periodic table of elements.

For the purposes of the invention, electrically conductive polymers are substances having an electrical conductivity greater than $10^{-2}$ S/cm as measured by the method of F. Beck, Ber. Bunsenges. Phys. Chem. 68 (1964), 558–567.

The polyacetylenes, ie. the polymers of acetylene, which are used in accordance with the invention are prepared, for example, by the procedure described in U.S. Pat. No. 3,092,613. The preparation of the starting polymers is not a subject of the present invention, but the process is advantageously carried out using nitrates, chlorides and acetylacetonates, and cobalt as the metal ion, instead of using nickel bromide trihydrate. It is preferable to use lithium borohydride or lithium alanate, or even phosphites, phosphines or hypophosphites, as the reducing agent, instead of using sodium borohydride as described in the U.S. patent. The polyacetylenes used can also have been prepared by the procedures described in Trans. Faraday Soc. 64 (1968), 823 et seq., J. Chem. Soc., Chem. Comm. 1977, 578–580 or Ber. Bunsenges. Phys. Chem. 68 (1964), 558–567. The polyacetylenes are insoluble in conventional solvents and are obtained as black partially crystalline materials. They have molecular weights of from 200 to 100,000, determined as described in Makromol. Chem. Rapid Communications 1 (1980), 523.

Using the novel process, a polyacetylene is reacted with from 1 to 100, preferably from 10 to 30, % by weight of tosylmethyl isocyanide and from 0.1 to 70, preferably from 5 to 35, % by weight of a complexing agent, the percentages being based on the weight of the polyacetylene. The reaction with tosylmethyl isocyanide is carried out as described in Tetrahedron Lett. 52 (1972), 5337–5340, tosylmethyl isocyanide being the compound

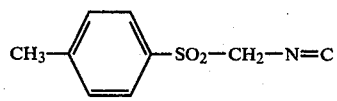

In this process, the acetylene polymer prepared as described in U.S. Pat. No. 3,092,613 is heated to 50°–250° C. for from 0.1 to 5 hours in the presence of tosylmethyl isocyanide and of a complexing agent from the group comprising the alkali metals or their amides, or the Lewis acids, excess additives are removed under reduced pressure, and the electrically conductive polymer obtained is then washed with water. The reaction is carried out in the presence or absence of a condensing agent, eg. potassium tert.-butylate. In a preferred procedure, the polyacetylene is first reacted with tosylmethyl isocyanide to give the polymer containing structural units of the formula (I):

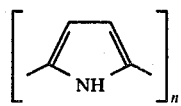

where n is 5–200, and this product is then reacted with an alkali metal or its amide, or with a Lewis acid, under the above process conditions.

Amongst the alkali metals, sodium and potassium are preferred complexing agents. For the purposes of the invention, the alkali metal amides are compounds of the type $MeNH_2$ (Me=alkali metal), sodium amide being preferred. Halogen derivatives of elements of groups III, IV, V, VI, VII and VIII of the periodic table of elements are preferably employed as Lewis acids.

In a particularly preferred procedure, one of the following is used as the Lewis acid: $AsF_5$, $SbF_5$, $UF_6$, $SbCl_5$, $AlCl_3$, $BF_3$, $FeCl_3$, $CF_3SO_3H$, $VOCl_3$, $HClO_4$, $NO^+SbF_6^-$, $NO_2^+SbF_6^-$, $NO^+AsF_6^-$, $XeF_4$, $NO^+PF_6^-$, $I_2$, $Br_2$, $ICl$, $PF_5$, $CrO_2Cl_2$, $NO_2^+PF_6^-$, $NO^+BF_4^-$, $NO^+ClO_4^-$, $(CF_3)_2SO_4$, $NbF_5$, $WF_6$, $FeCl_3$, $CdCl_2$ or $BF_3/CrOCl_2$.

Other Lewis acids suitable for use in the novel process are:

From Group VIII
  $KrF_2$, $XeOF_4$, $XeF_6$, $XeO_2F_2$ and $HXeO_4$,

From Group VII
  $ClF_3$, $ClF_5$, $BrF_3$, $IF_5$, $IF_7$, $BrCl$, $BrI$, $Cl_2O$, $Cl_2O_3$, $ClO_2$, $ClOClO_3$, $Cl_2O_6$, $Cl_2O_7$, $Br_2O$, $BrO_2$, $Br_2O_5$, $Br_3O_2$, $BrO_3$, $I_4O_5$, $I_2O_5$, $HClO$, $HClO_2$, $HClO_3$, $HClO_4$, $HOBr$, $HBrO_2$, $HBrO_3$, $HBrO_4$, $HIO_3$, $HIO_4$, $FClO_3$, $ClF_3O$, $ClF_3O_2$, $FClO_2$, $FClO$, $BrO_2F$, $BrO_3F$, $IO_2F$, $IOF_3$, $IO_2F_3$ and $IOF_5$, From Group VI
  $FSO_3H$, $(FSO_3F)$, $R(SO_2F)_2$ where R is NH, CH, FXe $(SO_3F)$, $FXe(OSeF_5)$, $FXe(OTeF_5)$, $Xe(OSeF_5)_4$, $Xe(OTeF_4)$, $FXe(OSeF_5)$, $F_{6-x}Cl(OSeF_5)_x$ where x is 1–5, and $FW (OSeF_5)_x$ where x is 1–6, From the sub-groups
  $AuF_5$, $PtF_6$, $IrF_6OsF_6$, $PtF_5$, $IrF_5$, $OsF_5$, $CrF_5$, $MoF_6$, $WF_5$, $MoF_5$, $VF_5$, $RuF_6$, $ReF_5$, $ReOF_5$, $CrO_2F_2$, $CrO_3$, $AuCl_3$, $PtCl_4$ and $AuCl_3$, From Group VI, in addition,
  $CF_3(CF_2)_nSO_3H$, $ClSO_3H$ and $Cl_2CHSO_3H$, From Group V
  $HPO_2F_2$, $P_2O_3F_4$, $PF_5$ and $BiX_3$ where X is F, Cl, Br or I, From Group IV
  $SiF_4$, $H_2SiF_6$, $GeX_4$, $SnX_4$ and $PbX_4$ where X is F, Cl or Br, From Group III
  $BX_3$, $AlX_3$, $GaX_3$ and $TlX_3$ where X is F, Cl, Br or I, From the sub-groups
  $ReF_6$, $ReCl_5$, $ReCl_4$, $ReOF_4$, $VOF_3$, $NbOF_3$, $TaOF_3$, $VCl_3$, $VF_3$, $NbCl_5$, $TaCl_5$, $NbOCl_3$, $TnOCl_3$, $UCl_5$, $CuX_2$, $AgX$, $AuX$ (X=Cl or Br), $ZnX_2$, $CdX_2$, $HgX_2$ (X=Cl, Br or I), $NiX$, $PdX_2$, $PtX_2$ (X=Cl, Br or I), $CoX_2$, $RhX_2$, $IrX_2$ (X=Cl, Br or I), $FeX_2$, $FeX_3$, $RuX_2$, $OsX_2$ (X=Cl, Br or I), $MnX_2$ (X=Cl, Br or I), $TiX_4$, $ZrX_4$ (X=F, Cl, Br or I), $SeX_3$, $Y_3X$, $LaX_3$, lanthanide $X_3$ (X=F, Cl, Br or I) and actinide $X_3$ and actinide $X_5$ (X=F, Cl or Br).

The reaction can be carried out using the gaseous reactants or using an acid assistant, eg. HF, $HOSeF_5$, $HOTeF_5$, $CF_3SO_3H$, $CF_3COOH$, $HClO_4$, a sulfo acid, $CF_3PO_3H$, $(CF_3)_2 POOH$, $HPF_6$, $H_2SiF_6$ or $H_2PO_2F_2$, or in an inert solvent, eg. $SO_2$, $SO_2Cl_2$, $SO_2F_2$, $SO_2ClF$, $CFCl_3HF$, $CH_3CN$, $CH_3NO_2$ or $C_2H_5NO_2$.

The electrically conductive polymeric systems prepared according to the invention and having conductivities greater than $10^{-2}$ S/cm may be used for the antistatic treatment of plastics, for the production of solar cells, for the conversion and fixing of radiation, and for the production of electrical and magnetic switches and electrical storage devices. The addition of the strong Lewis acid results in a p-conductor, and the addition of the alkali metal results in an n-conductor (cf. J. Chem. Education 46 (1969), No. 2, 82).

In the Examples which follow, parts are by weight.

EXAMPLES 1 TO 9

20 parts of tosylmethyl isocyanide and 15 parts of sodium amide was added to 100 parts of polyacetylene prepared as described in U.S. Pat. No. 3,092,613, the mixture was reacted at 85° C. for 3 hours, and the unreacted isocyanide was then stripped off at 80° C. under a pressure of 0.1 mm Hg. The polymer obtained and dried in this manner was electrically conductive. In this reaction, sodium amide was the condensing agent as well as the complexing agent, giving conductivity of the n type.

In the Examples which follow, various condensing agents and complexing agents are given, and the properties of the polymers prepared according to the invention are listed in the Table.

TABLE

| Example No. | Condensing agent (parts by weight) | Complexing agent (parts by weight) | Electrical conductivity [S/cm] |
|---|---|---|---|
| 1 | 15 $NaNH_2$ | — | $3.6 \cdot 10^{-2}$ |
| 2 | 15 Na | — | $3.6 \cdot 10^{-2}$ |
| 3 | 15 $KNH_2$ | — | $4.1 \cdot 10^{-2}$ |
| 4 | 15 K | — | $2.9 \cdot 10^{-2}$ |
| 5 | 15 $NaNH_2$ | 10 Na | $5.3 \cdot 10^{-1}$ |
| 6 | 20 $NaNH_2$ | 20 Na | $6.8 \cdot 10^{-1}$ |
| 7 | 10 Na | 25 Na | $5.0 \cdot 20^{-1}$ |
| 8 | 10 Na | 25 K | $4.5 \cdot 10^{+1}$ |
| 9 | 10 Na | 25 Na | $1.9 \cdot 10^{-1}$ |

EXAMPLES 10 TO 13

When the procedure of Examples 1 to 9 was followed and, after the condensation, the sodium amide was washed out, for example using dimethylformamide, and the product was then dried, it was possible to prepare p-conductors by doping this product with Lewis acids. In the Examples which follow, the Lewis acid used, which is the p-complexing agent, is varied.

| Example No. | Complexing agent (parts by weight) | Electrical conductivity [S/cm] |
|---|---|---|
| 10 | 15 $H_2SO_4$ | $4.2 \cdot 10^{-2}$ |
| 11 | 15 $HClO_4$ | $5.6 \cdot 10^{-2}$ |
| 12 | 15 $BF_3$ | $1.0 \cdot 10^{-2}$ |
| 13 | 25 $VOCl_3$ | $4.8 \cdot 10^{-1}$ |

We claim:
1. A process for the preparation of a stable electrically conductive polymer from a polyacetylene, the polymer having an electrical conductivity greater than $10^{-2}$ S/cm, which process consists essentially of treating the polyacetylene with from 1 to 100% by weight of tosylmethyl isocyanide and from 0.1 to 70% by weight of a dopant selected from the group consisting of an alkali metal, an alkali metal amide or a Lewis acid, the percentages being based on the polyacetylene.

2. A process as defined in claim 1, wherein the reaction is carried out using from 10 to 30% by weight of tosylmethyl isocyanide and from 5 to 35% by weight of an alkali metal or of its amide, or of a Lewis acid.

3. A process as defined in claim 1, wherein the reaction is first carried out with tosylmethyl isocyanide to give a polymer containing structural units of the formula (I):

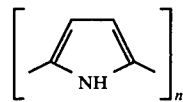

where n is 5–200, and this product is then reacted with an alkali metal or its amide, or with a Lewis acid.

4. A process as defined in claim 1, wherein a Lewis acid is used as the dopant and wherein the Lewis acid is a halogen derivative of an element of group III, IV, V, VI, VII or VIII of the periodic table of elements.

* * * * *